(12) United States Patent
Chandra (10) Patent No.: US 8,161,367 B2
(45) Date of Patent: Apr. 17, 2012

(54) CORRECTION OF SINGLE EVENT UPSET ERROR WITHIN SEQUENTIAL STORAGE CIRCUITRY OF AN INTEGRATED CIRCUIT

(75) Inventor: Vikas Chandra, San Jose, CA (US)

(73) Assignee: ARM Limited, Cambridge (GB)

( * ) Notice: Subject to any disclaimer, the term of this patent is extended or adjusted under 35 U.S.C. 154(b) by 862 days.

(21) Appl. No.: 12/285,517

(22) Filed: Oct. 7, 2008

(65) Prior Publication Data

US 2010/0088565 A1    Apr. 8, 2010

(51) Int. Cl.
*H04L 1/00* (2006.01)
(52) U.S. Cl. ............. 714/822; 714/726; 714/823; 326/9
(58) Field of Classification Search ............ 714/726, 714/819, 822, 823; 326/9–12
See application file for complete search history.

(56) References Cited

U.S. PATENT DOCUMENTS

| | | |
|---|---|---|
| 3,893,070 A | 7/1975 | Bossen et al. |
| 3,905,023 A | 9/1975 | Perpiglia |
| 4,227,175 A | 10/1980 | Newman |
| 4,339,657 A | 7/1982 | Larson et al. |
| 4,558,379 A | 12/1985 | Hutter et al. |
| 4,633,465 A | 12/1986 | Fitch et al. |
| 4,635,223 A | 1/1987 | Boone et al. |
| 4,669,092 A | 5/1987 | Sari et al. |
| 4,756,005 A | 7/1988 | Shedd |
| 4,833,635 A | 5/1989 | McCanny et al. |
| 4,885,715 A | 12/1989 | McCanny et al. |
| 4,918,709 A | 4/1990 | Fitch |
| 4,975,930 A | 12/1990 | Shaw |
| 5,043,990 A * | 8/1991 | Doi et al. ............... 714/820 |
| 5,203,003 A | 4/1993 | Donner |
| 5,276,690 A | 1/1994 | Lee et al. |
| 5,291,496 A | 3/1994 | Andaleon et al. |

(Continued)

FOREIGN PATENT DOCUMENTS

EP    0 366 331    5/1990

(Continued)

OTHER PUBLICATIONS

Goel, A.; Bhunia, S.; Mahmoodi, H.; Roy, K.;, "Low-overhead design of soft-error-tolerant scan flip-flops with enhanced-scan capability," Design Automation, 2006. Asia and South Pacific Conference on, vol., No., pp. 6 pp., Jan. 24-27, 2006.*

(Continued)

*Primary Examiner* — Jeffrey A Gaffin
*Assistant Examiner* — Steven Nguyen
(74) *Attorney, Agent, or Firm* — Nixon & Vanderhye P.C.

(57) ABSTRACT

Sequential storage circuitry includes first and second storage elements storing first and second indications of input data values received by the circuitry during first and second phases of a clock signal. Error detection circuitry detects a single event upset error in any of the first and second storage elements. Two additional storage elements are provided for storing third and fourth indications of the input data value respectively in response to a pulse signal derived from the clock signal. Included is comparison circuitry for comparing the third and fourth indications of the input data value and further comparison circuitry for comparing, during a first phase of the clock signal, the first indication and at least one of the third and fourth indications, and for comparing, during a second phase of the clock signal, the second indication and at least one of the third and fourth indications.

15 Claims, 8 Drawing Sheets

U.S. PATENT DOCUMENTS

| | | | |
|---|---|---|---|
| 5,313,625 | A | 5/1994 | Hess et al. |
| 5,321,705 | A | 6/1994 | Gould et al. |
| 5,400,370 | A | 3/1995 | Guo |
| 5,402,273 | A | 3/1995 | Tucker |
| 5,408,200 | A | 4/1995 | Buhler |
| 5,414,722 | A | 5/1995 | Tollum |
| 5,426,746 | A | 6/1995 | Sekiguchi |
| 5,455,536 | A | 10/1995 | Kono et al. |
| 5,463,351 | A | 10/1995 | Marko et al. |
| 5,504,859 | A | 4/1996 | Gustafson et al. |
| 5,509,076 | A | 4/1996 | Sprunk |
| 5,528,637 | A | 6/1996 | Sevenhans et al. |
| 5,553,232 | A | 9/1996 | Wilhite et al. |
| 5,572,662 | A | 11/1996 | Ohta et al. |
| 5,615,263 | A | 3/1997 | Takahashi |
| 5,625,652 | A | 4/1997 | Petranovich |
| 5,627,412 | A | 5/1997 | Beard |
| 5,630,154 | A | 5/1997 | Bolstad et al. |
| 5,737,369 | A | 4/1998 | Retzer |
| 5,859,551 | A | 1/1999 | Ohishi et al. |
| 5,862,141 | A | 1/1999 | Trotter |
| 5,870,446 | A | 2/1999 | McMahan et al. |
| 5,872,907 | A | 2/1999 | Griess et al. |
| 5,896,391 | A | 4/1999 | Solheim et al. |
| 5,914,903 | A | 6/1999 | Kanma et al. |
| 6,067,256 | A | 5/2000 | Yamashita et al. |
| 6,076,175 | A | 6/2000 | Drost et al. |
| 6,078,627 | A | 6/2000 | Crayford |
| 6,114,880 | A | 9/2000 | Buer et al. |
| 6,127,864 | A | 10/2000 | Mavis et al. |
| 6,148,423 | A | 11/2000 | Le Mouel et al. |
| 6,167,526 | A | 12/2000 | Carlson |
| 6,173,423 | B1 | 1/2001 | Autechaud et al. |
| 6,188,610 | B1 | 2/2001 | Kakizoe et al. |
| 6,222,660 | B1 | 4/2001 | Traa |
| 6,282,661 | B1 | 8/2001 | Micol |
| 6,453,431 | B1 * | 9/2002 | Bernstein et al. ............ 714/700 |
| 6,476,643 | B2 | 11/2002 | Hugues et al. |
| 6,523,201 | B1 | 2/2003 | De Michele |
| 6,650,661 | B1 | 11/2003 | Buchanan et al. |
| 6,693,985 | B2 | 2/2004 | Li et al. |
| 6,741,110 | B2 | 5/2004 | Roisen |
| 6,772,388 | B2 | 8/2004 | Cooper et al. |
| 6,799,292 | B2 | 9/2004 | Takeoka et al. |
| 6,802,033 | B1 | 10/2004 | Bertin et al. |
| 6,831,496 | B2 * | 12/2004 | Gardner ........................ 327/202 |
| 6,834,367 | B2 | 12/2004 | Bonneau et al. |
| 6,907,553 | B2 | 6/2005 | Popplewell et al. |
| 6,931,565 | B2 | 8/2005 | Hirabayashi |
| 6,944,067 | B2 | 9/2005 | Mudge et al. |
| 6,944,468 | B2 | 9/2005 | Okumura |
| 6,958,627 | B2 | 10/2005 | Singh et al. |
| 6,977,910 | B1 | 12/2005 | Hosur et al. |
| 6,985,547 | B2 | 1/2006 | Uht |
| 7,002,358 | B2 | 2/2006 | Wyatt |
| 7,010,074 | B2 | 3/2006 | Nakamura |
| 7,023,235 | B2 * | 4/2006 | Hoff ................................ 326/10 |
| 7,046,056 | B2 | 5/2006 | Kizer et al. |
| 7,061,294 | B1 | 6/2006 | Talledo et al. |
| 7,073,080 | B2 | 7/2006 | Lou |
| 7,085,993 | B2 | 8/2006 | Goodnow et al. |
| 7,096,137 | B2 | 8/2006 | Shipton et al. |
| 7,096,402 | B2 | 8/2006 | Yano et al. |
| 7,116,744 | B2 | 10/2006 | Saze et al. |
| 7,142,623 | B2 | 11/2006 | Sorna |
| 7,162,661 | B2 | 1/2007 | Mudge et al. |
| 7,188,284 | B2 * | 3/2007 | Mitra et al. ................... 714/726 |
| 7,236,555 | B2 | 6/2007 | Brewer |
| 7,257,173 | B2 | 8/2007 | Wood et al. |
| 7,260,742 | B2 | 8/2007 | Czajkowski |
| 7,278,074 | B2 * | 10/2007 | Mitra et al. ................... 714/724 |
| 7,278,076 | B2 * | 10/2007 | Zhang et al. ................. 714/726 |
| 7,278,080 | B2 | 10/2007 | Flautner et al. |
| 7,310,755 | B2 | 12/2007 | Mudge et al. |
| 7,320,091 | B2 | 1/2008 | Blaauw et al. |
| 7,323,946 | B2 | 1/2008 | Seefeldt et al. |
| 7,337,356 | B2 | 2/2008 | Mudge et al. |
| 7,401,273 | B2 | 7/2008 | Lee et al. |
| 7,482,831 | B2 * | 1/2009 | Chakraborty et al. ........... 326/12 |
| 7,546,519 | B2 * | 6/2009 | Agarwal ........................ 714/823 |
| 7,594,150 | B2 * | 9/2009 | Chakraborty et al. ........ 714/746 |
| 7,650,551 | B2 | 1/2010 | Flautner et al. |
| 7,671,627 | B1 | 3/2010 | Somani et al. |
| 7,782,125 | B2 | 8/2010 | Shimura |
| 7,797,575 | B2 | 9/2010 | Clark et al. |
| 2001/0016927 | A1 | 8/2001 | Poisner |
| 2002/0038418 | A1 | 3/2002 | Shimamura |
| 2004/0130351 | A1 | 7/2004 | Hazucha et al. |
| 2004/0199821 | A1 | 10/2004 | Flautner et al. |
| 2005/0162185 | A1 * | 7/2005 | Satsukawa ....................... 326/35 |
| 2007/0028157 | A1 * | 2/2007 | Drake et al. .................. 714/797 |
| 2010/0088565 | A1 | 4/2010 | Chandra |
| 2011/0126051 | A1 | 5/2011 | Flautner et al. |

FOREIGN PATENT DOCUMENTS

| | | |
|---|---|---|
| EP | 0 374 420 | 6/1990 |
| EP | 0 653 708 | 5/1995 |
| JP | 60-20398 | 2/1985 |
| JP | 62-24498 | 2/1987 |
| JP | 2001-175542 | 6/2001 |
| SU | 809350 | 2/1981 |
| WO | WO 00/54410 | 9/2000 |
| WO | WO 01/46800 | 6/2001 |
| WO | WO 2004/084072 | 9/2004 |

OTHER PUBLICATIONS

Oliveira, Roystein; Jagirdar, Aditya; Chakraborty, Tapan J.;, "A TMR Scheme for SEU Mitigation in Scan Flip-Flops," Quality Electronic Design, 2007. ISQED '07. 8th International Symposium on, vol., No., pp. 905-910, Mar. 26-28, 2007.*

Zhang, M.; Mitra, S.; Mak, T. M.; Seifert, N.; Wang, N. J.; Shi, Q.; Kim, K. S.; Shanbhag, N. R.; Patel, S. J.;, "Sequential Element Design With Built-In Soft Error Resilience," Very Large Scale Integration (VLSI) Systems, IEEE Transactions on, vol. 14, No. 12, pp. 1368-1378, Dec. 2006.*

Devarapalli, S.V.; Zarkesh-Ha, P.; Suddarth, S.C.;, "SEU-Hardened Dual Data Rate Flip-Flop Using C-Elements," Defect and Fault Tolerance in VLSI Systems (DFT), 2010 IEEE 25th International Symposium on, vol., No., pp. 167-171, Oct. 6-8. 2010.*

U.S. Appl. No. 11/636,716, filed Dec. 11, 2006, Das et al.
U.S. Appl. No. 12/078,189, filed Mar. 27, 2008, Chandra et al.
U.S. Appl. No. 12/461,740, filed Aug. 21, 2009, Blaauw et al.
U.S. Appl. No. 12/923,911, filed Oct. 13, 2010, Flautner et al.
U.S. Appl. No. 12/923,908, filed Oct. 13, 2010, Flautner et al.
U.S. Appl. No. 12/926,084, filed Oct. 25, 2010, Flautner et al.
Office Action mailed Jun. 23, 2010 in co-pending U.S. Appl. No. 11/636,716.
Office Action mailed Aug. 3, 2011 in co-pending U.S. Appl. No. 12/923,911.
Final Office Action mailed Dec. 7, 2010 in co-pending U.S. Appl. No. 11/636,716.
Office Action mailed Jul. 13, 2011 in co-pending U.S. Appl. No. 11/636,716.
Office Action mailed Aug. 29, 2011 in co-pending U.S. Appl. No. 12/078,189.
P. Hazucha et al, "Measurements and Analysis of SER-Tolerant Latch in a 90-nm Dual-$V_T$ CMOS Process" *IEEE Journal of Solid-State Circuits*, vol. 39, No. 9, Sep. 2004, pp. 1536-1543.
S. Mitra et al, "Robust System Design with Built-In Soft-Error Resilience" IEEE Computer Society Feb. 2005, pp. 43-52.
M. Keating et al, "Low Power Methodology Manual for System-on-Chip Design" p. 216.
Kanekawa et al, "Fault Detection and Recovery Coverage Improvement by Clock Synchronized Duplicated Systems with Optimal Time Diversity" *Fault-Tolerant Computing*, Jun. 1998, pp. 196-200.
"ARM710 Data Sheet" Dec. 1994, Advanced RISC Machines Ltd. (ARM).
F. Worm et al, "An Adaptive Low-Power Transmission Scheme for On-Chip Networks" *ISSS'02*, Oct. 2002, pp. 92-100.
Enomoto et al, "A low-power, high speed 0.25 μm GaAs D-FF" Proceedings of the 23$^{rd}$ European Solid-State Circuits Conference, 1997, ESSCIRC '97, Sep. 16-18, 1997, pp. 300-303.

S. Mitra et al, "Logic Soft Errors in Sub-65nm Technologies Design and CAD Challenges" *DAC 2005*, Jun. 2005, pp. 2-4.

M. Zhang et al, "Sequential Element Design With Built-In Soft Error Resilience" *IEEE Transactions on Very Large Scale Integration (VLSI) Systems*, vol. 14, No. 12, Dec. 2006, pp. 1368-1378.

A.J. Drake et al, "A Self-Correcting Soft Error Tolerant Flop-Flop" 12$^{th}$ NASA Symposium on VLSI Design, Oct. 2005.

V. Chandra et al, "Impact of Technology and Voltage Scaling on the Soft Error Susceptibility in Nanoscale CMOS" *DFTVS '08*, IEEE International Symposium on Defect and Fault Tolerances of VLSI Systems, 2008.

U.S. Appl. No. 13/064,207, filed Mar. 10, 2011, Coudhury et al.

Hill et al. "An Accurate Flip-Flop Selection Technique for Reducing Logic SER", *Dept. of Electrical and Computer Engineering—Univ. of Wisconsin*, No Date, pp. 1-9.

Rockett, "An SEU-Hardened CMOS Data Latch Design", *IEEE Transactions on Nuclear Sciences*, vol. 35, No. 6, Dec. 1998, pp. 1682-1687.

Karnik et al., "Characterization of Soft Errors Caused by Single Event Upsets in CMOS Processes", *IEEE Transactions on Dependable and Secure Computing*, vol. 1, No. 2, Apr. 2004, pp. 128-143.

Li et al., "Low Power Dissipation SEU-hardened CMOS Latch", *Piers Online*, vol. 3, No. 7, 2007, pp. 1080-1084.

Dabiri et al., "Soft Error-Aware Power Optimization using Gate Sizing", *Computer Science Dept.—Univ. of California*, No Date, pp. 1-10.

Zhang et al., "Design for Resilience to Soft Errors and Variations", *IEEE Computer Society*, 2007, 6 pages.

Huang et al., "A New Radiation Hardened by Design Latch for Ultra-Deep-Sub-Micron Technologies", *IEEE Computer Society*, 2008, pp. 175-176.

Das et al., "RazorII: In Situ Error Detection and Correction for PVT and SER Tolerance", *IEEE Journal of Solid-State Circuits*, vol. 44, No. 1, Jan. 2009, pp. 32-48.

Jagirdar et al., "A Robust Architecture for Flip-Flops Tolerant to Soft-Errors and Transients from Combinational Circuits", *IEEE Computer Society*, 2008, pp. 39-44.

Calin et al., "Upset Hardened Memory Design for Submicron CMOS Technology", *IEEE Transactions on Nuclear Science*, vol. 43, No. 6, Dec. 1996, pp. 2874-2878.

Naseer et al., "DF-DICE: A Scalable Solution for Soft Error Tolerant Circuit Design", *ISCAS 2006*, pp. 3890-3893.

Jargirdar et al., "Efficient Flip-Flop Designs for SET/SEU Mitigation with Tolerance to Crosstalk Induced Signal Delays", *Rutgers University*, 24 pages.

Giacomotto et al., "Energy Efficiency of Power-Gating in Low-Power Clocked Storage Elements", *PATMOS Proceedings*, No Date, 9 pages.

Goel et al, "Low-Overhead Design of Soft-Error-Tolerant Scan Flip-Flops with Enhanced-Scan Capability", *IEEE*, 2006, pp. 665-670.

S. Das, "Razor: A Variability-Tolerant Design Methodology for Low-Power and Robust Computing", *Computer Science and Engineering—Univ. of Michigan*, 2009, pp. 1-122.

K. Seshadri, "Reduction of Architecture Vulnerability Factor using Modified Razor Flip-flops", *Dept. of Electrical and Computer Engineering*—Univ. of Maryland, 2007, pp. 1-61.

Mitra et al., "Robust System Design with Built-in Soft-Error Resilience", *IEEE Computer Society*, Feb. 2005, pp. 43-52.

Calin et al, "Upset-Tolerant CMOS SRAM Using Current Monitoring: Prototype and Test Experiments", *International Test Conference IEEE 1995*, pp. 45-53.

A. Venkatraman et al, "A Robust, Fast Pulsed Flip-Flip Design" *GLSVLSI'08*, May 2008, pp. 119-122.

S. Mitra et al, "Built-In Soft Error Resilience for Robust System Design" IEEE, 2007, pp. 1-6.

S. Mitra "Built-In Soft Error Resilience for Robust System Design" power point presentation pp. 1-34 & 36-45 www.ewh.ieee.org/r6/scv/rl/articles/ser.talk.grid.vl.pdf.

\* cited by examiner

SEU in latch 40
FIG. 9

SEU in latch 42
FIG. 10

FIG. 11

CORRECTION OF SINGLE EVENT UPSET ERROR WITHIN SEQUENTIAL STORAGE CIRCUITRY OF AN INTEGRATED CIRCUIT

BACKGROUND OF THE INVENTION

1. Field of the Invention

The field of the invention relates to the correction of soft errors or single event upset errors, such as those that arise from neutron or alpha particle strikes, within sequential storage circuitry of integrated circuits

2. Description of the Prior Art

A soft error or Single Event Upset Error (SEU) is a disturbance of a node within a circuit due to a hit on the silicon substrate by either high energy neutrons or alpha particles. Such a hit can produce a change of state or a transient voltage pulse at sensitive nodes in integrated circuits such as processors. Errors can occur due to SEU where it leads to a change in state in the state-holding elements that determine the architectural state of the integrated circuit, such as the RAM arrays, the register file, the architectural-state registers of a processor, or the flip-flops and latches within control logic. In the context of this document we consider an error due to SEU as a state flip in any state-holding element inside the integrated circuit.

The traditional technique for protecting such elements as SRAM arrays is by the use of error correction techniques. For example, error correcting codes or ECC can be used to flag errors and then correct them. Due to the high density of SRAM such techniques are very effective as generally SEUs inside such memories only cause a single bit flip, which is easy to correct with ECCs. However, due to the spatial distribution of flip-flops and latches throughout the integrated circuit and due to the fact that neutron and particle strikes in such distributed logic can cause separate bit failures within multiple of the sequential storage circuits, ECCs are not appropriate for correcting these errors.

Figure 1:
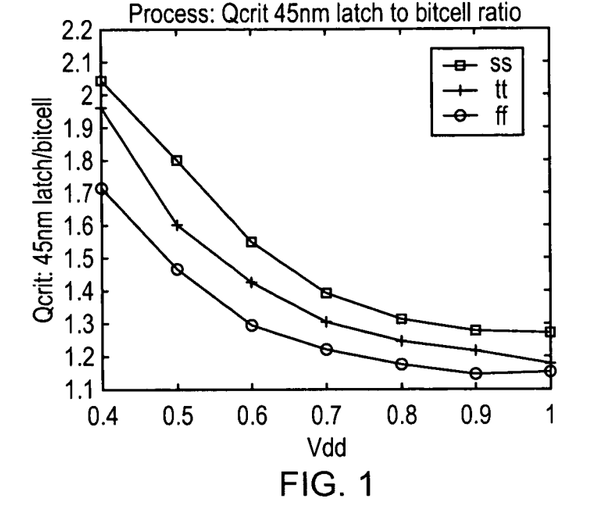
FIG. 1 schematically shows the ratio of latch to bit cell stability (defined as the critical charge Qcrit) at 45 nm for different VDDs.

With the process technology shrinking, the susceptibility of latches and flip-flops to soft errors to such SEUs is increasing and indeed at 45 nm it can be shown to be very similar to that of SRAMs. FIG. 1 shows that latches are just 20% more robust to such SEUs than SRAM at a nominal voltage.

With this increase in susceptibility of such devices to SEUs, many techniques have recently been proposed to address this problem. There is usually trade-offs between area, performance, power overhead and such additional robustness.

There are three main ways in which this problem can be addressed.

Firstly, the flip-flop/latch can be designed so that it is more difficult to flip the cell due to an SEU.

Secondly, a device that detects such a soft error can be designed. In such devices if the data gets corrupted due to an SEU, this is detected and hence the error can be rectified by the system by flushing the error form it.

Thirdly the device can be designed so that the output does not change even if an SEU flips one of the cells. Generally this involves adding redundancy inside the device to detect and correct the error.

The first technique has overheads such as resizing, adding capacitance to nodes and adding feedback associated with it.

The second technique involves adding redundancy to the system and comparing the stored value with the redundant value, thereby detecting the errors. An error detecting flip-flop is described in commonly assigned co-pending US application U.S. Ser. No. 12/078,189 filed on 27 Mar. 2008 the entire contents of which is hereby incorporated by reference.

There are two main problems with this technique.

Firstly the technique detects the error but does not correct it. Thus, a system level reset is needed to flush the error. This can be costly in terms of performance and power.

Secondly the technique can detect false positives. For example an SEU occurring in the redundant element will generate an error signal and there is no way to discriminate between real and false errors.

The present invention addresses both of these problems.

The third technique has the advantage of both detecting and correcting the errors avoiding the need for system level resets.

Such an error correcting technique is described in S. Mitra, N. Seifert, M. Zhang, Q. Shi and K. S. Kim, "Sequential Element Design with Built-In Soft Error Resilience," IEEE Transactions on VLSI Systems, Vol. 14, No. 12, December 2006.

Figure 2:
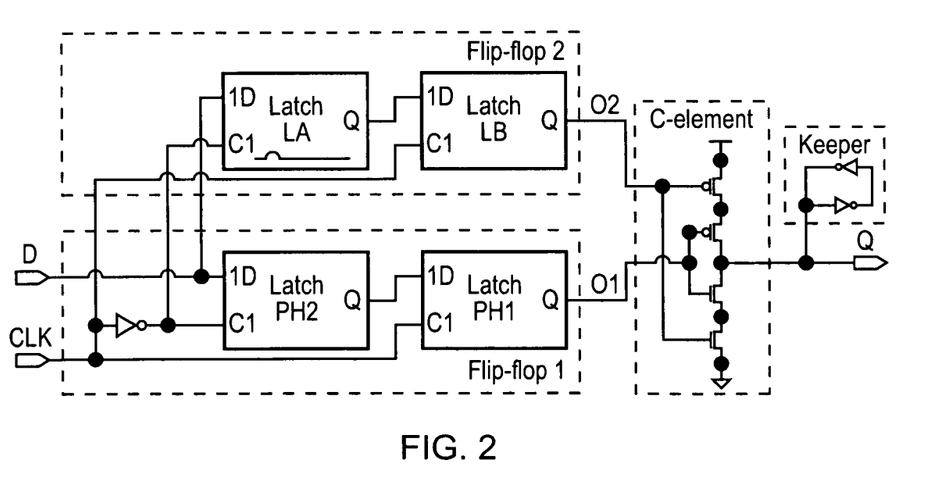
FIG. 2 shows an error correcting flip flop design according to the prior art.

FIG. 2 shows an example of such a flip flop. The idea is to replicate the master and slave latches and use a C-element to compare the two outputs. When new data is latched at Latch PH2, it also gets latched in Latch LA. Similarly, when the data is latched in Latch PH1, it also gets latched in Latch LB. In other words, the latches LA/LB are shadows of the actual data in latches in latches PH2/PH1. A C-element has the property that it lets a new data propagate only if the two inputs (O1 and O2) match, otherwise it retains the old data. So, if there is a soft error in any one of the latches, the error is not propagated and the previous data is retained at the output by the keeper latch.

The design of FIG. 2 has five sequential elements (four master-slave latches and a keeper latch) in addition to an asynchronous C element.

Figure 3:
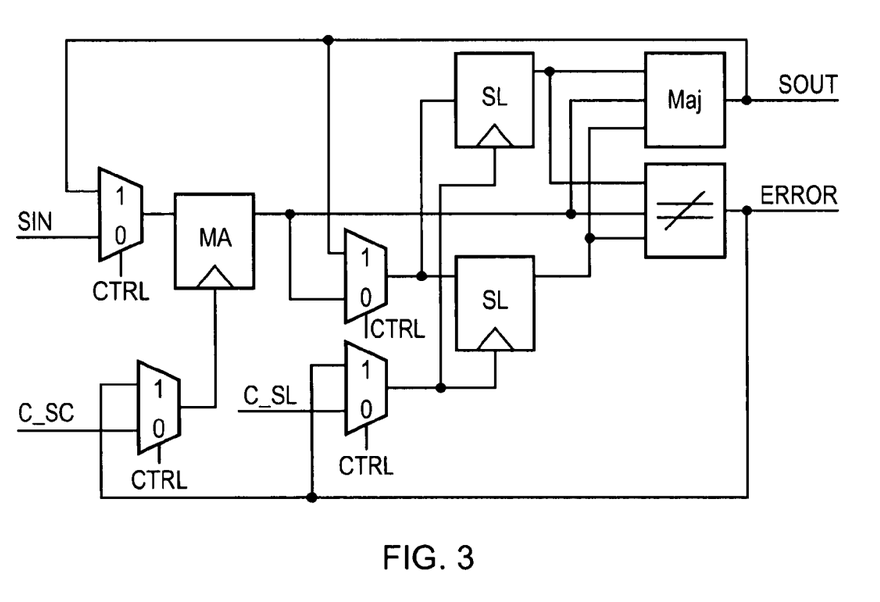
FIG. 3 shows an alternative error correcting flip flop design according to the prior art.

An alternative error correcting technique is a triple module redundancy scheme where the storage elements are replicated three times and a voting is performed to output the data value held by the majority. Such a technique is described in A. Drake, A. J. Kleinosowski, A. K. Martin, "A Self-Correcting Soft Error Tolerant Flop-Flop," 12th NASA Symposium on VLSI Design, 2005 and is illustrated in FIG. 3. The Drake scheme is an example of feedback correction, where the data is latched back in the design to do the correction.

In Drake et al. the clock signal is modified to lead the majority value back into the system in case of an SEU. Modifying the clock path can lead to other issues such as set-up violation. For example, where the SEU occurs near to the rising edge of the clock, the flip flop might not get the new data while it is busy correcting the error.

It would be desirable to have a sequential storage element that could both detect and correct SEUs while limiting additional overheads such as increase in area, power etc.

SUMMARY OF THE INVENTION

Viewed from one aspect the present invention provides sequential storage circuitry for an integrated circuit, comprising: storage circuitry comprising: a first storage element for storing, during a first phase of a clock signal, a first indication of an input data value received by said sequential storage circuitry; a second storage element coupled to an output of said first storage element, for storing a second indication of said input data value during a second phase of said clock signal; and error detection circuitry for detecting a single event upset error in any of said first and second storage elements comprising: two additional storage elements for storing third and fourth indications of said input data value respectively in response to a pulse signal derived from said clock signal; comparison circuitry for comparing said third and fourth indications of said input data value; and further comparison circuitry for comparing during a first phase of said clock signal said first indication and at least one of said third and fourth indications, and for comparing during a second phase of said clock signal said second indication and at least one of said third and fourth indications; and output circuitry for correcting any detected errors in said storage circuitry and for outputting an output value; said output circuitry being responsive to no match by said comparison circuitry to output said first indication during a first phase of said clock signal and said second indication during said second phase of said clock signal, and said output circuitry being responsive to a match by said comparison circuitry to output a value in dependence upon comparisons performed by said further comparison circuitry; said output circuitry being responsive to a match by said further comparison circuitry during a first phase of said clock signal to output said first indication during said first clock cycle and to a no match to output an inverted value of said first indication; and said output circuitry being responsive to a match by said further comparison circuitry during a second phase of said clock signal to output said second indication during said second phase of said clock signal and to a no match to output an inverted value of said second indication.

In accordance with the present invention single event upset errors occurring in either the first storage element or the second storage element of the sequential storage circuitry can be detected and corrected on the fly without changing the value in any of the latches of the design. In effect the correction happens only in the last multiplexer stage which results in a feed forward error correcting system and avoids the need of having to feed the error correction back into the system. This provides an efficient system which can react faster than a system where the error is fed back into the system and values change within the latches. Furthermore, it requires less power as latches do not need to be flipped. The system simply takes advantage of the fact that if there is an error stored in one of the latches then rather than outputting its value simply outputting the inverse of its value will provide the correct answer. Thus, there is no need to change the value that is stored.

Thus, in accordance with the present invention, single event upset errors occurring in either of the first storage element or the second storage element of the sequential storage circuitry can be detected and corrected using two additional storage elements and some comparison circuitry.

In accordance with the present invention the additional storage elements are driven by a pulse signal derived from the clock signal used to control the first and second storage elements. More particularly on occurrence of such a pulse signal, the additional storage elements store an indication of the input data value received by the sequential storage circuitry. This indication of the input data value may be the data value itself or it may be some other indication such as an inverse of the data value.

Error detection circuitry in the form of comparison circuitry is then used to detect a single event upset error in any of the storage elements. If such an error is detected in either of the two additional storage elements then no error correction is made as such an error is in effect a false error as these are the redundant elements and do not store the data that is output. In this way, this circuitry is able to detect false errors and not act on then.

If an error occurs in the first or second storage elements, then during the first phase of the clock signal the error detection circuitry can detect a single event upset error in the first storage element by comparing it with a value stored in either of the additional storage elements. The value stored in the first storage element is the value that is output during the first phase of the clock signal and thus, detection of a single upset error at this time enables the value that is currently being output to be corrected if necessary. During the second phase of the clock signal the circuitry detects errors in the second storage element by comparing the values stored there with one of the values in either of the additional storage elements. Any difference between the stored values indicate an error in the second storage element and this value which is output during the second phase of the clock cycle can then be corrected.

In this way, data output by the circuit can be corrected if a single event upset error occurs in either of the two sequential storage elements that store the data.

In some embodiments, said sequential storage circuitry comprises error detection signal generation circuitry for combining an output of said comparison circuitry and said further comparison circuitry to generate an error or no_error signal to be sent to said output circuitry, wherein said comparison circuitry comprises circuitry responsive to a difference in said third and fourth indications to output an error_mask signal to said error detection signal generation circuitry, said error detection signal generation circuitry being responsive to said error_mask signal to generate said no_error signal, said output circuitry being responsive to said no_error signal not to correct an output of said storage circuitry, said output of said storage circuitry comprising said first indication during a first phase of said clock cycle and said second indication during a second phase of said clock cycle.

If there is a difference in the third and fourth indications output by the additional storage elements then this indicates that a single event upset error has occurred in the additional storage elements and thus, this is in effect a false error as the data values in these elements are redundant values that are not used as output data but are simply used to detect errors in the first and second storage elements. Thus, an error_mask signal is generated which indicates to the output circuitry that no correction should be performed to the data values output. It should be noted, that in this way, the circuitry is able to detect single event upset errors but cannot detect two such errors occurring as such an error occurring in the additional storage elements means that they can no longer be used to detect an error in the first and second storage elements. Thus, if an error occurs there too it cannot be corrected. However, these soft errors are generally called single event upset errors as they occur due to neutron or alpha particle strikes and typically occur as single events. Thus, the inability to detect two errors occurring within a clock cycle is not generally a problem, as such occurrence of errors is indeed rare in flip-flops and latches due to their large layout area.

In some embodiments, said error detection signal generation circuitry is responsive to a difference in an output of either said third or fourth indication and an output of said storage circuitry detected by said further comparison circuitry and to no receipt of an error_mask signal to generate said error signal, said output circuitry being responsive to said error signal to correct an output of said storage circuitry by inverting said output.

A difference in an output of either of the additional stored indications and an indication output by the output circuitry indicates an error in that value output and this can be simply corrected by inverting it. Thus, it is only the value output that is changed and none of the stored values in the storage elements need be varied.

In some embodiments, a data output path for outputting data from said storage circuitry to said output circuitry and an error correction path comprising said further comparison circuitry and a path for outputting a no match signal from said further comparison circuitry to said output circuitry are balanced such that in response to an output from said storage circuitry switching value due to said single event error, said output circuitry receives said switched value at about a same time as said no match signal.

For the present technique to work efficiently without providing glitches in the signal output then the no match signal from the further comparison circuit must reach the output circuit at about the same time as the switched value reaches it. This is because the no match signal is the signal to the output circuitry to correct the value output. Thus, if the signal to correct the value output arrives at the output circuitry at about the same time as the error arrives the value is corrected almost immediately and no glitch or a very small glitch in the system occurs. If these paths are not well balanced then either the no match signal arrives late and the output value switches to the wrong value and is later corrected thereby producing a glitch or the no match signal arrives early and the correct value is switched to an incorrect value, this being corrected when the incorrect value arrives and is itself switched. Such glitches do not impact the functionality but can cause extra power consumption. However, careful design and balancing of the paths can reduce such a problem substantially.

In some embodiments, said comparison circuitry output path to said output circuitry is shorter than said output path of said further comparison means to said output circuitry such that said output circuitry receives said comparison result of said comparison circuitry before said comparison result of said further comparison circuitry.

An additional potential problem with this technique is that the generation of an error in the redundant elements which is in effect a false error needs to be detected as such and this detection sent to the error correcting output circuit before it is used to correct an error that doesn't exist. Thus, it is important that the comparison circuitry output path to the output circuitry is shorter than the output path of the further comparison means to the output circuitry. If this is the case the output circuitry receives the information that there is a soft error in the redundant elements before it receives any potential false errors signal and thus, it knows that no corrections should be performed when the false error arrives.

In some embodiments, said comparison circuitry output path to said error detection signal generation circuitry is shorter than said output path of said further comparison means to said error detection signal generation circuitry such that said further circuitry receives said comparison result of said comparison circuitry before said comparison result of said further comparison circuitry.

In some embodiments further circuitry is used to combine the outputs of the comparison circuitry and the further comparison circuitry and generate an error signal that is then sent to the output circuitry. If such an embodiment is used then it is the output paths from the comparison means and the further comparison means to this further circuitry that need to be carefully chosen such that an error mask signal is received at this further circuitry before a false error signal and thus, the false error signal is in effect masked and no false error is produced. If the paths are not correctly balanced then there will be a glitch as the false error causes a correction of a correct value before this correction is overwritten in response to the error_mask signal.

In some embodiments, said output circuitry comprises an inverter for inverting a signal output by said storage circuitry, said storage circuitry outputting said first indication during a first phase of said clock cycle and said second indication during a second phase of said clock cycle and a multiplexer for selecting between said output signal or said inverted output signal in response to an error detection signal output by said error detection circuitry.

Although, the correction by the output circuitry can be done in a number of ways an inverter is a simple way of inverting the signal output by the storage circuitry, with a multiplexer being used to select between the inverted output signal and the non-inverted output signal. This is a simple area and power efficient way of correcting for soft errors occurring in the first or second storage elements.

In some embodiments, said error detection circuitry comprises error detection signal generation circuitry for generating said error detection signal in response to a match signal from said comparison circuitry and a no match signal from said further comparison circuitry.

A further aspect of the present invention provides an integrated circuit comprising a plurality of sequential storage circuitry elements according to a first aspect of the present invention, and a clock pulse generator for generating a clock pulse in response to a start of said first phase of said clock signal, said clock pulse generator supplying said clock pulse to said plurality of sequential storage circuitry elements.

In some embodiments said integrated circuit further comprises combinatorial circuitry interposed between said plurality of sequential storage elements.

A still further aspect of the present invention provides a method of correcting a single event upset error in sequential storage circuitry of an integrated circuit, said sequential storage circuitry of said integrated circuitry comprising a first storage element and a second storage element coupled to an output of said first storage element, and a third and fourth storage element the method comprising the steps of: storing in said first storage element during a first phase of a clock signal, a first indication of an input data value received by said sequential storage circuitry; storing in said second storage element during a second phase of said clock signal a second indication of said input data value; storing in said third and fourth storage elements on occurrence of a pulse signal derived from said clock signal, a respective third and fourth indication of said input data value; detecting a single event upset error in any of said storage elements by: (i) comparing said third and fourth indication and in response to a difference detecting said single event upset error is in said third or fourth storage elements; (ii) comparing during said first phase of said clock signal said input data value as indicated by said first indication at least one of said third and fourth indication of said input value and if there is a difference and step (i) found no lo difference detecting said single event upset error is in said first storage element; and (iii) comparing during said second phase of said clock signal said input data value as indicated by said second indication and at least one of said third and fourth indication of said input value and if there is a difference and step (i) found no difference detecting said single event upset error is in said second storage element; and correcting in an output value a detected single event upset error in said first or second storage elements and outputting said output value by: during said first phase of said clock signal either: outputting said first indication of said input value in response to detection of no single event upset error in said first storage element; or outputting an inverted value of said first indication of said input value in response to detection of a single event upset error in said first storage element; and during said second phase of said clock signal either: outputting said second indication of said input value in response to detection of no single event upset error in said second storage element; or outputting an inverted value of said second indication of said input value in response to detection of no single event upset error in said second storage element.

A yet further aspect of the present invention provides a sequential storage means comprising: a storage means for storing an indication of data received in a first storage element during a first phase of a clock signal, and for storing an indication of said data in a second storage element during a second phase of said clock signal; a further third and fourth storage means for storing an indication of said data in response to a pulse signal derived from said clock signal; error detecting means for detecting a single event upset error in said storage means by: detecting said single event upset error in said third or fourth storage means if there is a difference in said stored value; and if there is no difference detecting said single event upset error in said first storage element if during said first phase of said clock signal there is a difference in said stored value and at least one of said stored values in said third and fourth storage means; and detecting said single event upset error in said second storage element if during said second phase of said clock signal there is a difference in said stored value and at least one of said stored values in said third and fourth storage means; and output means for correcting in an output value said single event upset error occurring in said first or second storage elements and outputting said output value, said output means comprising: correction means for inverting a value output by said storage means in response to detection of a single event upset error in either said first or said second storage elements and not inverting said value in response to no detection of said single event upset error.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 4:
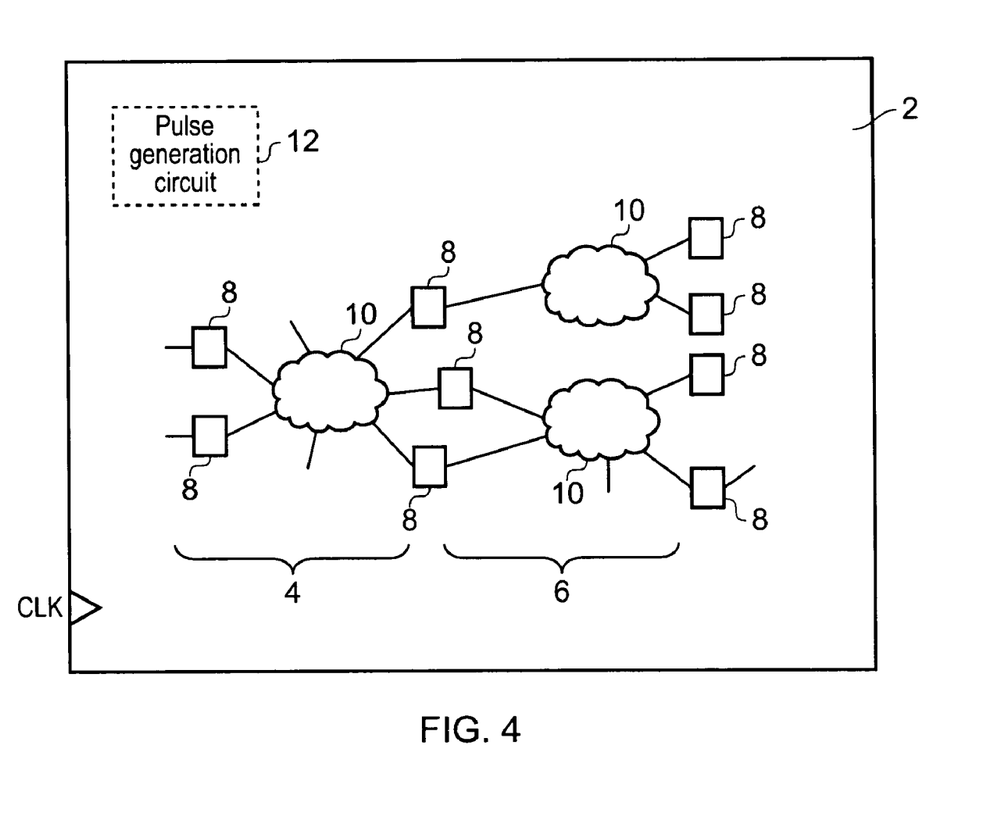
FIG. 4 schematically illustrates an integrated circuit incorporating sequential storage circuits, combinatorial logic and a pipelined architecture.

FIG. 4 shows an integrated circuit 2 including pipeline stages 4, 6 extending between sequential edge triggered storage circuit 8 which may be in the form of flip flops. Between the sequential storage circuits are respective incidences of combinatorial logic circuitry 10 which serve to receive signals from one or more preceding stages and to generate signals to be passed to one or more succeeding stages. The period of time between the capture of signal values by the sequential storage elements 8 for successive clock periods is the time that is available for the combinatorial logic circuitry 10 to evaluate its input so as to generate its output. Embodiments of the present invention provide a new design for the sequential storage circuit 8 which can detect and correct SEU's or soft errors occurring within the sequential storage circuit due to neutron or alpha particle strikes on the sequential storage circuit.

Integrated circuit 2 further comprises pulse generation circuit 12 which generates a pulse from the clock signal clk and transmits this pulse to each of the sequential storage circuits 8. This pulse circuit is used to trigger retention of data in redundant latches as will become clear from a description of FIGS. 5 and 6.

Figure 5:
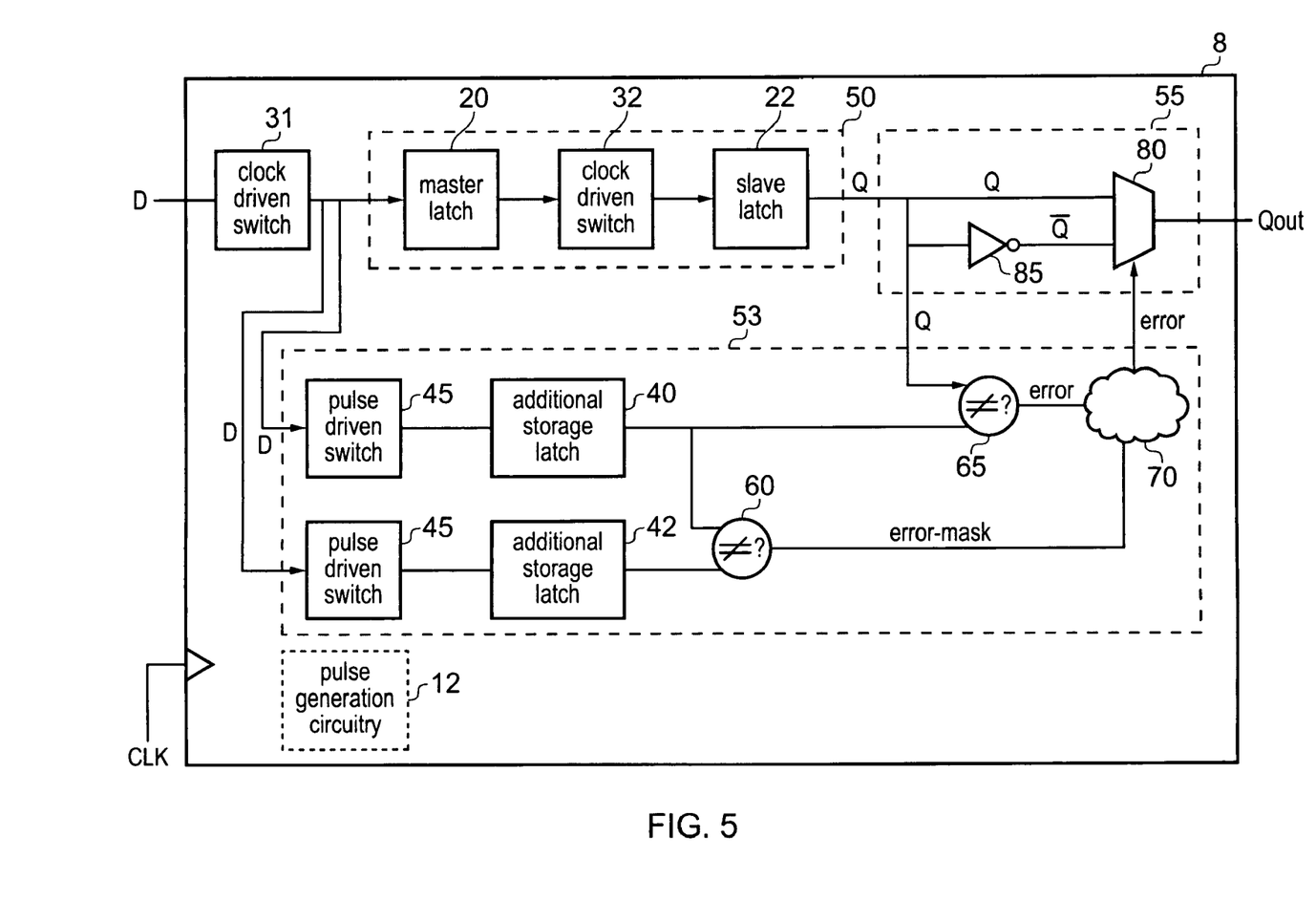
FIG. 5 is a block diagram illustrating the arrangement of a sequential storage circuit in accordance with one embodiment of the present invention.

FIG. 5 shows a block diagram schematically illustrating the sequential storage circuitry 8 of FIG. 4. Sequential storage circuitry 8, comprises storage portion 50 having a master latch 20 connected in series with a slave latch 22, the master latch 20 receiving an input data value D via clock driven switch 31. This value D passes through clock driven switch 32 to slave latch 22 and then on to output Q. Clock driven switch 31 is responsive to the rising edge of the clock in this embodiment while clock driven switch 32 is responsive to the falling edge. As will be appreciated by those skilled in the art, the master and slave latches 20, 22 are level based devices, but by placing them in series the sequential storage circuit 15 then becomes an edge triggered device. In particular, the master latch 20 and the slave latch 22 are driven by alternate phases of the clock, such that during a first phase of the clock the master latch 20 stores a first indication of the data value with the clock driven switch 32 outputting the stored value to the slave latch 20. In the first phase of the clock the slave latch is transparent and thus, merely passes this input value through to the output Q. However, during the second phase of the clock the master latch 100 becomes transparent and the clock driven switch 32 turns off, isolating the input to the slave latch 22 from the master latch 20. During the second phase the slave latch 22 becomes opaque and stores the data value and provides that data value at the output Q.

In this embodiment two additional redundant storage latches 40 and 42 are provided for the detection of soft errors. These are controlled by pulse driven switches 45. Although, in this embodiment these pulse driven switches are shown as two independent switches it will be clear to the skilled person that a single switch with two outputs could be used. The pulse driven switches 45 receive a brief pulse signal once per clock cycle, this pulse signal being generated by pulse generation circuitry 12. The pulse generation circuitry 12 generates the pulse signal from the clock signal clk. In this embodiment, the pulse generation circuitry 12 generates the pulse on occurrence of the rising edge of the clock signal, although it is clear to the skilled person that it could equally well generate the pulse in response to the falling edge of the clock signal. In either case, it simply generates a single pulse per clock cycle. Although, the pulse generation circuitry 12 is shown in FIG. 4 as being a single circuit that generates a pulse for all of the sequential storage circuitry 8 on the integrated circuit 2, in other embodiments the pulse generation circuitry 12 may be within sequential storage circuitry 8 as is shown by the dotted box in this Figure.

On occurrence of the pulse, the pulse driven switches 45 provide the data D to the additional storage latches 40 and 42.

When the pulse ends the latches 40 and 42 become opaque and store the data received from the pulse driven switch 45. Also, at this time the pulse driven switch turns off to prevent any new value being received by the additional storage latches 40 and 42.

Sequential storage circuitry can be thought of as being in three separate parts which are shown by dotted boxes 50, 53 and 55. Portion 50 is the storage portion and comprises the master latch 20 and slave latch 22. Portion 53 can be seen as the error detection circuitry and comprises the redundant storage latches 40 and 42. It also comprises comparators 60 and 65 and additional logic 70. Portion 55 is the output portion which corrects the data values output by the storage portion 50 if an error is detected by error detection circuitry 53 and outputs either the uncorrected value if no error has been detected or the corrected value if an error has been detected.

Error detection circuitry 53 has comparator 60 which compares the value stored in the two additional storage latches 40 and 42. If these values are not equal then it outputs an error_mask signal to error signal generation circuitry 70. This error_mask signal indicates to error signal generation circuitry 70 that a soft error has occurred in one of the two additional storage latches as they don't store the same value and thus, it is assumed that the values stored in the master and slave latch are correct. It should be noted that even had a soft error occurred in either of the master or slave latch it could not be corrected for as it is unclear which of the two additional storage latches stores the correct value. Thus, in response to receiving an error mask signal from comparator 60 error signal generation circuitry 70 outputs a no_error signal to output circuitry 55. Output circuitry 55 responds to a no_error signal to select via multiplexer 80 the output of storage circuitry 50, i.e. Q.

If comparison circuitry 60 does not output an error_mask signal in other words the value stored in the two additional storage latches 40 and 42 are equal then an error in either master latch 20 or slave latch 22 can be detected using comparison circuitry 65. Comparison circuitry 65 compares the value stored in one of the additional storage latches, in this case additional storage latch 40 with a value that is currently being output by storage circuitry 50. In this embodiment it will be the value stored in master latch 20 during the first phase of the clock cycle and the value stored in slave latch 22 during the second phase of the clock cycle. If comparison circuitry 65 detects a difference in the values stored in additional storage latch 40 and the value output by storage circuitry 50 then it generates an error signal to the error signal generation logic 70 and if no error_mask signal is currently being received by this circuitry this error signal is propagated to multiplexer 80 within output circuitry 55. In response to this error signal multiplexer 80 selects the inverted output of storage element 50. Thus, in this case the inverted value of the output circuitry is output as it is known that the current value that is output is in fact incorrect. If the comparison circuitry 65 finds that the value stored in additional storage latch 40 is equal to the value output by storage circuitry 50 Q then it generates a no_error signal and in response to this multiplexer 80 outputs Q.

Figure 6:
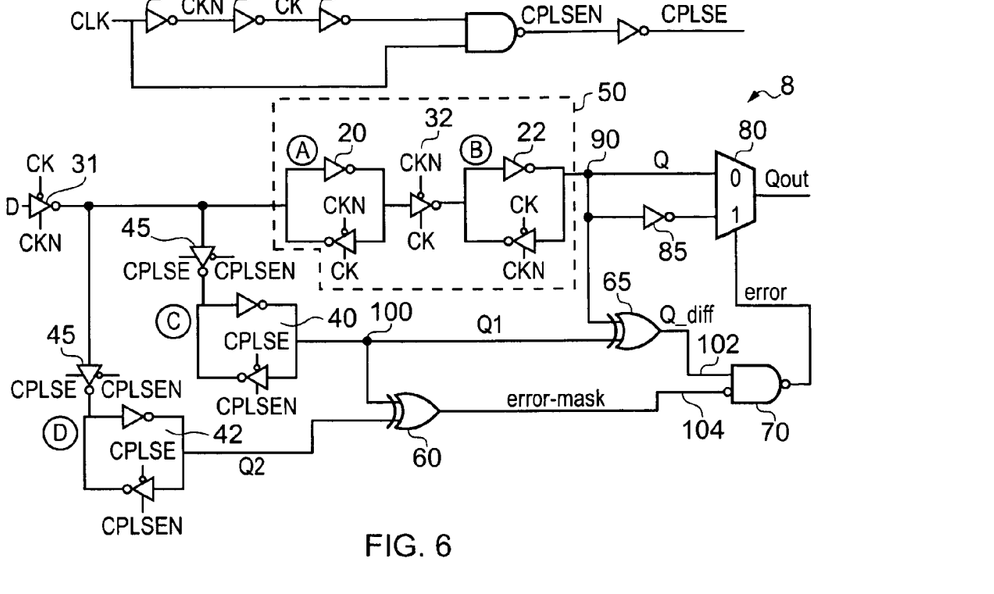
FIG. 6 is a circuit diagram illustrating one particular embodiment of the sequential storage circuit of FIG. 5.

FIG. 6 shows a circuit diagram of one particular implementation of the sequential storage circuit of FIG. 5. In this circuit, clock driven switch 31 separates the input data D from master latch 20 and clock driven switch 32 separates master latch 20 from slave latch 22. As can be seen, these clock driven switches are designed to operate on different phases of the clock signal. Pulse generation circuitry 12 is also shown. In this diagram the same references numerals as those used in FIG. 5 are used to illustrate like features. Thus, comparison circuitry 60 of FIG. 5 is in this diagram XOR gate 60 which outputs an error_mask signal of 1 if either of the two inputs are not equal and a signal of 0 if they are equal. Similarly, comparison circuitry 65 that compares the output Q of storage circuitry 50 is XOR gate 65 and outputs a Q_diff of 0 if the two inputs are the same and a 1 if they are different. Error signal generation circuitry 70 is in this embodiment an AND gate with an inverter on its input 104. Thus, if an error_mask signal of 1 is output this appears at the AND gate as a 0 and thus, generates a 0, which is the no_error signal.

Operation of the circuit of FIG. 6 is now described in conjunction with the timing diagram of FIGS. 7 to 10.

Figure 7:
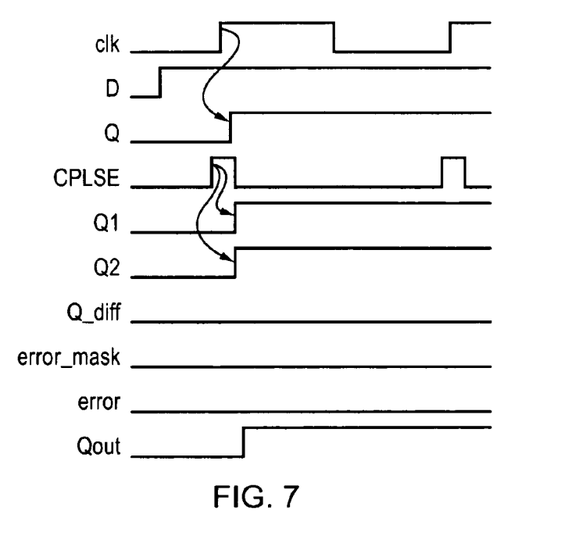
FIG. 7 is a timing diagram of the operation of the circuit of FIG. 6 in the absence of soft errors.

In FIG. 7, when the clock signal rises, a pulse CPLSE is generated by pulse generating circuit 12. This circuit can be shared across a number of sequential storage circuits 8, to decrease area overhead. The width of the pulse is controlled by the number of inverters 13. The rising CLK signal latches the data in the master latch 20. Pulse CPLSE, also latches the data in the two shadow latches 40, 42 at approximately the same time. Once the data gets stored in the shadow latches during the high phase of CPLSE it remains stable until the next rising edge of CLK generates the next pulse. In the absence of any errors the data stored in the shadow or redundant latches 40 and 42 will be the same as that in master latch when CLK is 1 and the same as that in slave latch when CLK is 0 as can be seen from the timing diagram of FIG. 7.

Thus, data input and captured at the rising edge of the clock in master latch 20 is also captured in the two shadow latches 40 and 42. Once latched, the data in latches 40 and 42 will not change, absent any errors till the next pulse, CPLSE occurring at the next rising edge of CLK. Master latch 20 is opaque during the high period of CLK and slave latch 22 is opaque during the low period of CLK. In both phases of CLK, the value Q reflects the data which is latched by the master latch 20 at the rising edge of CLK. In an ideal case without any soft error the nodes Q, Q1 and Q2 will all have the same values as is shown in FIG. 7 which is how the design operates in the absence of SEU faults.

Since Q1 and Q2 are identical the error_mask signal stays at 0. Also, since Q and Q1 are identical, the Q_DIFF signal and consequently error signal also stay at 0. A 0 error signal means that the state of the system has not been corrupted by a SEU and hence the multiplexer 80 propagates Q to Qout. Thus, absent any errors Qout follows D and hence this proposed sequential storage circuit behaves like a traditional flip flop.

If a particle strike changes the value stored in any of the four latches the nodes Q, Q1 and Q2 will differ. The proposed design uses two XOR gates, an AND gate and a 2:1 multiplexer to make sure that the corrupted data does not propagate to the output. To understand how the flip flop corrects the soft errors the following single bit error cases are considered.

Figure 8:
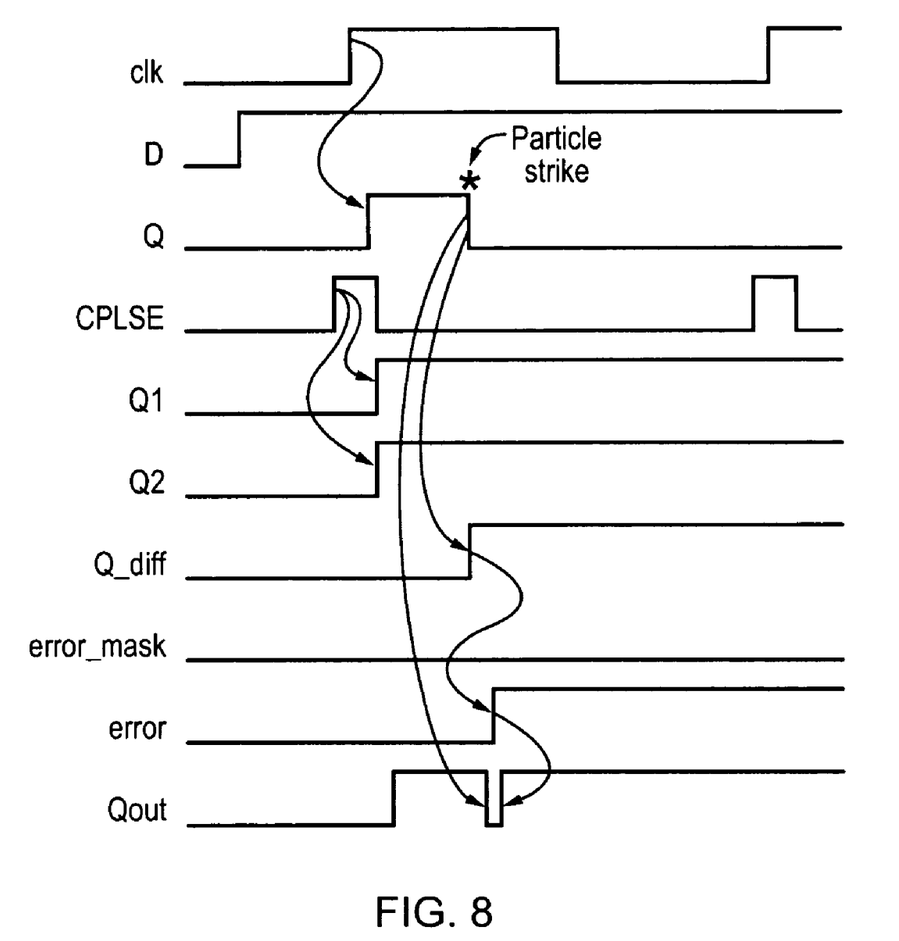
FIG. 8 is a timing diagram of the operation of the circuit of FIG. 6 when a soft error flips latch a or latch b.

FIG. 8 shows the first case where an SEU occurs in master latch 20. It will be appreciated that this is identical to what happens if the soft error occurs in slave latch 22 except that the timing diagram of FIG. 8 would be shown with the particle strike occurring during the lower portion of the clock phase rather than during the high phase.

As can be seen from the timing diagram of FIG. 8 master latch 20 is opaque only when CLK is high. So in this case, the assumption is that the particle strike happens in master latch 20 when the clock is in the high phase. As can be seen from the timing diagram the particle strike flips the latch 20 as is marked by the asterix and at this point the latch 20 changes from a 1 to 0 and hence Q toggles from 1 to 0. Qout follows Q and it transitions to 0 as well. The difference in Q and Q1 cause Q_diff to become a 1. The error_mask signal remains at 0 as Q1 and Q2 are identical and this indicates that the soft error is not in one of the redundant latches. Thus, a transition in Q_diff causes the error signal output by AND gate 70 to become 1. The high transition in the error signal causes the multiplexer to select the inverted value of Q output by inverter 85 and thus, Qout is corrected. As can be seen the output Qout recovers the correct value after a short glitch. There are a few things to note in this. The duration of the glitch can be minimized or at least reduced by balancing the data path and the error path. Thus, when Q flips it is advantageous if the time it takes to output this flipped Q is similar to the time it takes to detect the error and change the multiplexer's selection. In other words the paths from node 90 to the input of multiplexer 80 should be similar to the path from node 90 to the select input of the multiplexer 80.

It should be noted that the above analysis also holds true for the case when the master latch 20 flips from 0 to 1, and also for the case when the particle strike happens in the slave latch during the lower phase of the clock cycle.

Thus, as can be seen this scheme for error correction will correct all single bit errors which happen in either master latch or slave latch during either phases of the clock. It should be noted that there is a window of vulnerability to this circuit which occurs during the pulse CPLSE. If a soft error occurs then, then the circuit will not detect it.

Figure 9:
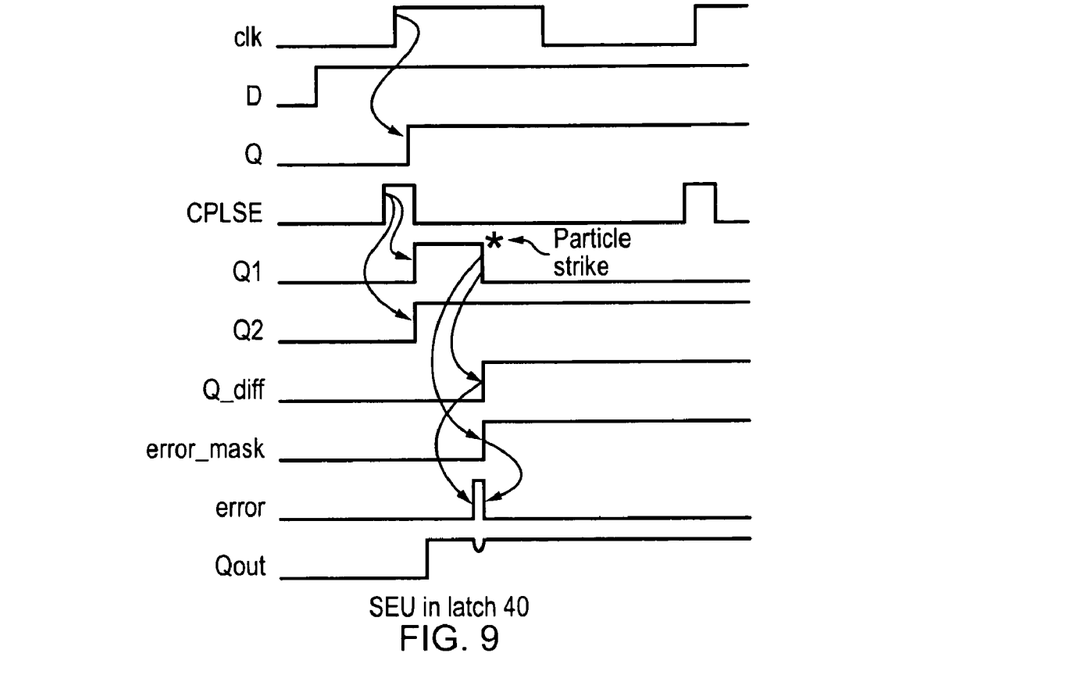
FIGS. 9 and 10 shows error correction when a soft error flips either of the redundant latches of FIG. 6.
Figure 10:
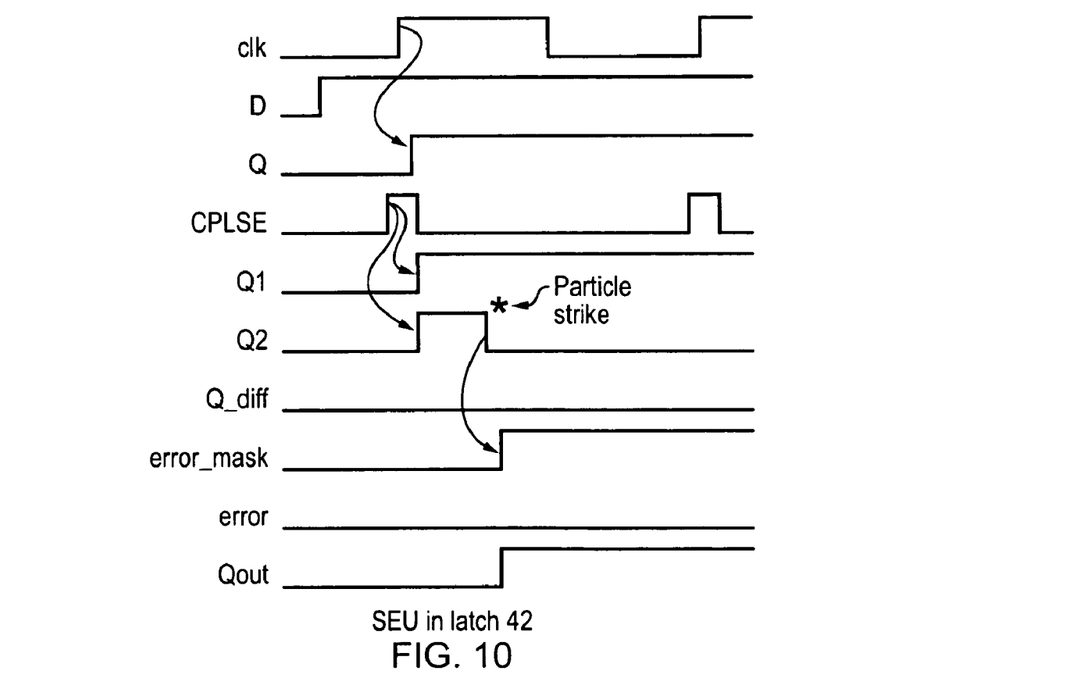

FIGS. 9 and 10 show what occur when a soft error happens in either of the redundant latches. In FIG. 9 the error happens in redundant latch 40 and in FIG. 10 in redundant latch 42.

Since the latches 40 and 42 are redundant latches it is critical that soft errors in these latches are not marked as real errors. The particle strike shown again as an asterisk in the Figures flips the latch 40 or 42 from 1 to 0 and hence Q1 or Q2 changes to a 0. Since Q1 and Q2 differ, the error_mask signal transitions to a 1. The error_mask signal gates the error and hence the error in both cases will be suppressed to 0. However, due to differences in path lengths there may be a small glitch in the error signal. If the paths are balanced, the glitch in the error signal can be reduced minimized or removed and the effect on Qout will be negligible as is shown in FIGS. 9 and 10.

As noted the duration of the glitch in the error signal can be minimized or completely removed by balancing the paths. In this case, the paths that are important are the error_mask path that should be balanced with, or preferable be shorter than, the path through comparator 65. Comparator 65 will generate a false error if latch 40 receives a hit from a soft error. It should be noted that as latch 42 is not used in the comparison of the output signal Q it cannot generate a false error or glitch. Thus, the path from node 100 to the input to AND gate 70 at 102 should be longer than the path from node 100 through comparator 60 to the input of AND gate 70 at 104. If the path through comparator 60 is shorter then the error_mask signal arrives at AND gate 70 before the Q_diff signal arrives there and any error generated by the Q_diff signal is masked out. If it is not shorter then the Q_diff signal causes an error signal to be generated from AND gate 70 and the inverted output of Q is selected until the error_mask signal arrives and corrects the error signal to a no_error signal and the correct output Q is then selected.

It should be noted that the above analysis also holds for the case when the redundant latch is flipped from 0 to 1 and when the particle strike happens during the low phase of the clock.

Figure 11:
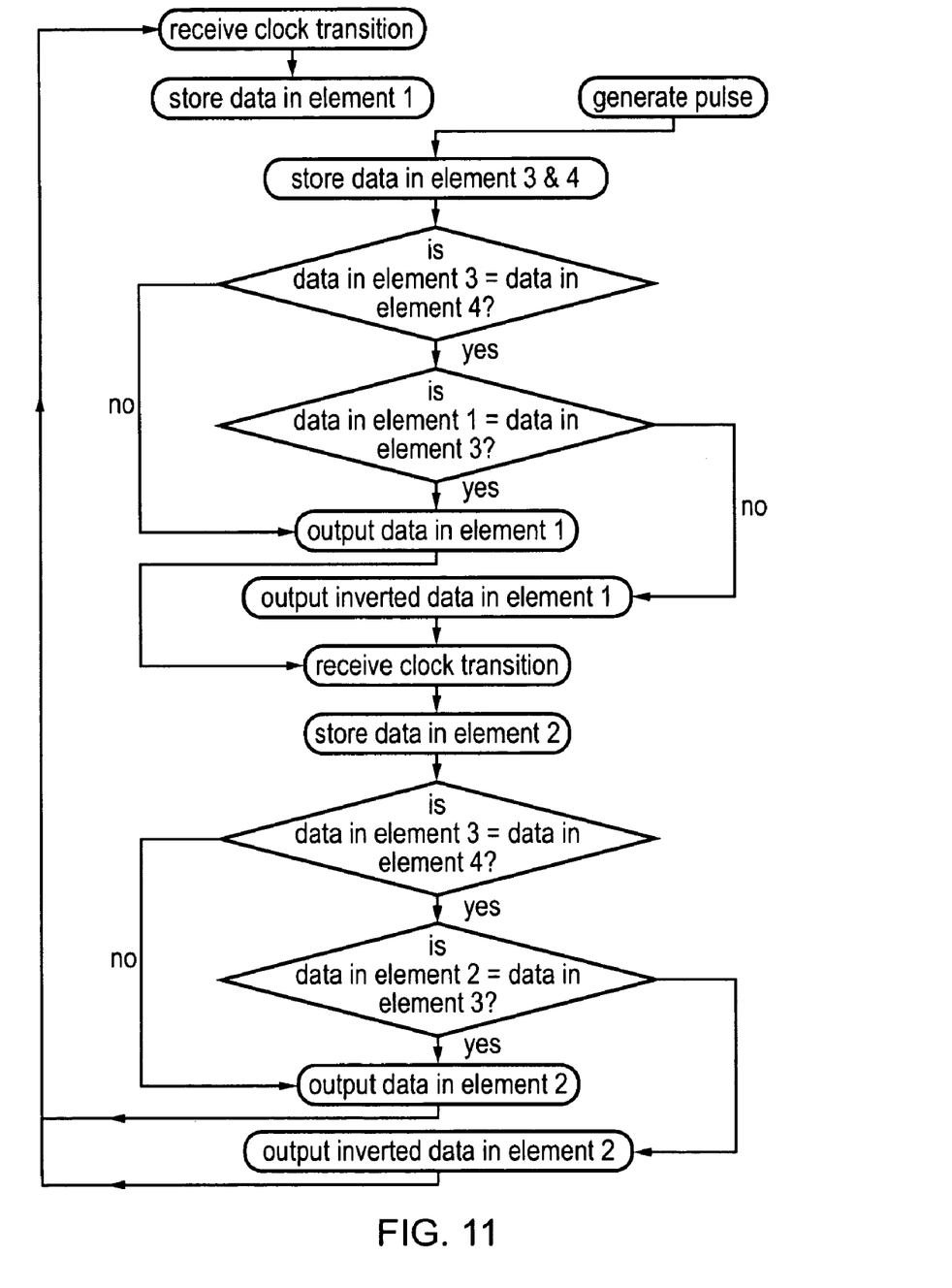
FIG. 11 is a flow diagram illustrating a method of performing an embodiment of the present invention.

FIG. 11 shows a flow diagram illustrating the method of operation of the sequential storage circuit of embodiments of the present invention. In response to receipt of a clock transition, data is stored in a first storage element and a pulse is generated by a pulse generation circuit. The generation of the pulse triggers data to be stored in redundant storage elements 3 and 4. A comparison is then performed of the data stored in elements 3 and 4 and if the data is not equal then the data stored in element 1 is output. If the data stored in elements 3 and 4, the redundant storage elements, is the same then this indicates that there are no soft error within these elements and the data stored in the first storage element is then compared with the data stored in either one of element 3 or 4. If they are not the same then this shows a soft error has occurred in element 1 and that the data output from this element should be inverted. If they are the same then this shows that there has been no soft error to the data stored in element 1 and this data itself can be output.

A next clock transition is received and the data in element 1 is stored in element 2. A check is then again made to see if the data in element 3 and the data in element 4 are still the same. In other words, has a soft error occurred in these elements. If the data is not the same then a soft error has occurred and the data stored in element 2 is output. This is because in such a case a single error has occurred in either of elements 3 or 4 and therefore it is assumed it has not occurred in element 2. If they are the same then the data stored in one of these elements is compared with the data stored in element 2. If they are the same then the data stored in element 2 is output and if they are not the same then this shows a soft error has occurred in element 2 and the inverted data of that stored in element 2 is output.

A clock transition is then received again and data received at an input is then stored in element 1 and the process is repeated. In summary, it should be noted that embodiments of the present invention are able to correct single event upset errors in both the master and slave latches as well as detecting when they occur in the redundant latches, thereby avoiding correcting for false errors. Since this is a self correcting sequential storage circuit the system does not need to be reset in the event of a soft error as the error never propagates out of the storage circuit. Further, the design is oblivious to soft errors occurring in the redundant latches and hence does not detect or correct false positives. The design detects and corrects the errors within this sequential storage circuit which is cheaper than having the detection and/or correction outside of the circuit.

Additionally, pulse based redundant latches are used which enables there to be three latches at a given time to compare and correct the errors. Due to the pulse based scheme the overhead is less than other proposed prior art techniques. Furthermore, the design adapts easily to standard design flow with no extra requirements, for example there are no extra pins.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims. For example, various combinations of the features of the following dependent claims could be made with the features of the independent claims without departing from the scope of the present invention.

I claim:

1. Sequential storage circuitry for an integrated circuit, comprising:

storage circuitry comprising:

a first storage element for storing, during a first phase of a clock signal, a first indication of an input data value received by said sequential storage circuitry;

a second storage element coupled to an output of said first storage element, for storing a second indication of said input data value during a second phase of said clock signal; and error detection circuitry for detecting a single event upset error in any of said first and second storage elements comprising:

two additional storage elements for storing third and fourth indications of said input data value respectively in response to a pulse signal derived from said clock signal;

comparison circuitry for comparing said third and fourth indications of said input data value; and further comparison circuitry for comparing during a first phase of said clock signal said first indication and at least one of said third and fourth indications, and for comparing during a second phase of said clock signal said second indication and at least one of said third and fourth indications; and output circuitry for correcting any detected errors in said storage circuitry and for outputting an output value;

said output circuitry being responsive to no match by said comparison circuitry to output said first indication during a first phase of said clock signal and said second indication during said second phase of said clock signal, and said output circuitry being responsive to a match by said comparison circuitry to output a value in dependence upon comparisons performed by said further comparison circuitry;

said output circuitry being responsive to a match by said further comparison circuitry during a first phase of said clock signal to output said first indication during said first clock cycle and to a no match to output an inverted value of said first indication; and said output circuitry being responsive to a match by said further comparison circuitry during a second phase of said clock signal to output said second indication during said second phase of said clock signal and to a no match to output an inverted value of said second indication.

2. Sequential storage circuitry according to claim 1, comprising error detection signal generation circuitry for combining an output of said comparison circuitry and said further comparison circuitry to generate an error or no_error signal to be sent to said output circuitry, wherein said comparison circuitry comprises circuitry responsive to a difference in said third and fourth indications to output an error_mask signal to said error detection signal generation circuitry, said error detection signal generation circuitry being responsive to said error_mask signal to generate a no_error signal, said output circuitry being responsive to said no_error signal not to correct an output of said storage circuitry, said output of said storage circuitry comprising said first indication during a first phase of said clock cycle and said second indication during a second phase of said clock cycle.

3. Sequential storage circuitry according to claim 2, wherein said error detection signal generation circuitry is responsive to a difference in an output of either said third or fourth indication and an output of said storage circuitry detected by said further comparison circuitry and to no receipt of an error_mask signal to generate said error signal, said output circuitry being responsive to said error signal to correct an output of said storage circuitry by inverting said output.

4. Sequential storage circuitry according to claim 3, wherein said comparison circuitry output path to said error detection signal generation circuitry is shorter than said output path of said further comparison means to said error detection signal generation circuitry such that said further circuitry receives said comparison result of said comparison circuitry before said comparison result of said further comparison circuitry.

5. Sequential storage circuitry according to claim 1, wherein said storage circuitry comprises a master slave flip flop, said first storage element comprising said master latch and said second storage element comprising said slave latch.

6. Sequential storage circuitry according to claim 1, wherein a data output path for outputting data from said storage circuitry to said output circuitry and an error correction path comprising said further comparison circuitry and a path for outputting a no match signal from said further comparison circuitry to said output circuitry are balanced such that in response to an output from said storage circuitry switching value due to said single event error, said output circuitry receives said switched value at about a same time as said no match signal.

7. Sequential storage circuitry according to claim 1, wherein said comparison circuitry output path to said output circuitry is shorter than said output path of said further comparison means to said output circuitry such that said output circuitry receives said comparison result of said comparison circuitry before said comparison result of said further comparison circuitry.

8. Sequential storage circuitry according to claim 1, wherein said output circuitry comprises an inverter for inverting a signal output by said storage circuitry, said storage circuitry outputting said first indication during a first phase of said clock cycle and said second indication during a second phase of said clock cycle and a multiplexer for selecting between said output signal or said inverted output signal in response to an error detection signal output by said error detection circuitry.

9. Sequential storage circuitry according to claim 8, wherein said error detection circuitry comprises error detection signal generation circuitry for generating said error detection signal in response to a match signal from said comparison circuitry and a no match signal from said further comparison circuitry.

10. An integrated circuit comprising a plurality of sequential storage circuitry elements according to claim 1, and a clock pulse generator for generating a clock pulse in response to a start of said first phase of said clock signal, said clock pulse generator supplying said clock pulse to said plurality of sequential storage circuitry elements.

11. An integrated circuit according to claim 10, and further comprising combinatorial circuitry interposed between said plurality of sequential storage elements.

12. A method of correcting a single event upset error in sequential storage circuitry of an integrated circuit, said sequential storage circuitry of said integrated circuitry comprising a first storage element and a second storage element coupled to an output of said first storage element, and a third and fourth storage element the method comprising the steps of:

storing in said first storage element during a first phase of a clock signal, a first indication of an input data value received by said sequential storage circuitry;

storing in said second storage element during a second phase of said clock signal a second indication of said input data value;

storing in said third and fourth storage elements on occurrence of a pulse signal derived from said clock signal, a respective third and fourth indication of said input data value;

detecting a single event upset error in any of said storage elements by:

(i) comparing said third and fourth indication and in response to a difference detecting said single event upset error is in said third or fourth storage elements;

(ii) comparing during said first phase of said clock signal said input data value as indicated by said first indication and at least one of said third and fourth indication of said input value and if there is a difference and step (i) found no difference, detecting said single event upset error is in said first storage element; and (iii) comparing during said second phase of said clock signal said input data value as indicated by said second indication and at least one of said third and fourth indication of said input value and if there is a difference and step (i) found no difference, detecting said single event upset error is in said second storage element; and correcting in an output value a detected single event upset error in said first or second storage elements and outputting said output value by:

during said first phase of said clock signal either:
outputting said first indication of said input value in response to detection of no single event upset error in said first storage element; or
outputting an inverted value of said first indication of said input value in response to detection of a single event upset error in said first storage element; and during said second phase of said clock signal either:
outputting said second indication of said input value in response to detection of no single event upset error in said second storage element; or
outputting an inverted value of said second indication of said input value in response to detection of no single event upset error in said second storage element.

13. A sequential storage means comprising:

a storage means for storing an indication of data received in a first storage element during a first phase of a clock signal, and for storing an indication of said data in a second storage element during a second phase of said clock signal;

a further third and fourth storage means for storing an indication of said data in response to a pulse signal derived from said clock signal;

error detecting means for detecting a single event upset error in said storage means by:

detecting said single event upset error in said third or fourth storage means if there is a difference in said stored value; and if there is no difference detecting said single event upset error in said first storage element if during said first phase of said clock signal there is a difference in said stored value and at least one of said stored values in said third and fourth storage means; and detecting said single event upset error in said second storage element if during said second phase of said clock signal there is a difference in said stored value and at least one of said stored values in said third and fourth storage means; and output means for correcting in an output value said single event upset error occurring in said first or second storage elements and outputting said output value, said output means comprising:

correction means for inverting a value output by said storage means in response to detection of a single event upset error in either said first or said second storage elements and not inverting said value in response to no detection of said single event upset error.

14. A sequential storage means according to claim 13, wherein said storage means is for outputting said indication of data received in said first storage element during said first phase of a clock signal, and for outputting an indication of said data in said second storage element during a second phase of said clock signal.

15. A sequential storage means according to claim 14, wherein said output means comprises an inverting means for inverting said value output by said storage means and a selecting means for selecting said inverted value in response to detection of a single event upset error in either said first or said second storage elements and for selecting said output value in response to no detection of said single event upset error.

* * * * *